(12) United States Patent
Jeong

(10) Patent No.: US 10,976,348 B2
(45) Date of Patent: Apr. 13, 2021

(54) TEST SOCKET ASSEMBLY

(71) Applicant: LEENO INDUSTRIAL INC., Busan (KR)

(72) Inventor: Jae-hwan Jeong, Busan (KR)

(73) Assignee: LEENO INDUSTRIAL INC.

( * ) Notice: Subject to any disclaimer, the term of this patent is extended or adjusted under 35 U.S.C. 154(b) by 291 days.

(21) Appl. No.: 16/135,145

(22) Filed: Sep. 19, 2018

(65) Prior Publication Data
US 2019/0018045 A1 Jan. 17, 2019

Related U.S. Application Data

(63) Continuation of application No. PCT/KR2017/003040, filed on Mar. 22, 2017.

(30) Foreign Application Priority Data

Mar. 23, 2016 (KR) .................. 10-2016-0034619

(51) Int. Cl.
*G01R 1/04* (2006.01)
*G01R 1/073* (2006.01)
(Continued)

(52) U.S. Cl.
CPC ......... *G01R 1/07378* (2013.01); *G01R 1/045* (2013.01); *H01R 12/88* (2013.01); *H01R 13/24* (2013.01); *H01R 2201/20* (2013.01)

(58) Field of Classification Search
CPC ...... G01R 1/073; G01R 1/07378; G01R 1/04; G01R 1/045; G01R 1/0416;
(Continued)

(56) References Cited

U.S. PATENT DOCUMENTS

2002/0063566 A1  5/2002  Bruno et al.
2004/0104113 A1  6/2004  Tomita
(Continued)

FOREIGN PATENT DOCUMENTS

CN  1539083 A   10/2004
CN  204597077 U  8/2015
(Continued)

OTHER PUBLICATIONS

International Search Report (PCT/KR2017/003040), WIPO, dated Aug. 1, 2017.
(Continued)

*Primary Examiner* — Son T Le
(74) *Attorney, Agent, or Firm* — Park & Associates IP Law, P.C.

(57) ABSTRACT

A test socket assembly for electrically connecting a contact point to be tested in a test object and a contact point for testing in a testing circuit. The test socket assembly includes: a plurality of signal probes; a socket block including a bottom surface facing toward the testing circuit, a top surface facing toward the test object, a plurality of probe holes for accommodating the plurality of signal probes to be parallel with one another while opposite ends of the signal probes are exposed from the top surface and the bottom surface, and a recessed portion recessed from at least partial area of the top surface and the bottom surface excluding a circumferential area of the probe holes; and an elastic grounding member accommodated in the recessed portion and made of a conductive elastic material to come into contact with at least one of the test object and the testing circuit.

4 Claims, 6 Drawing Sheets

(51) Int. Cl.
*H01R 12/88* (2011.01)
*H01R 13/24* (2006.01)

(58) Field of Classification Search
CPC ............ G01R 1/07307; G01R 31/2808; G01R 31/28; G01R 31/2817; H01R 12/88; H01R 13/24; H01R 2201/20
See application file for complete search history.

(56) References Cited

U.S. PATENT DOCUMENTS

| | | | | |
|---|---|---|---|---|
| 2004/0212383 | A1* | 10/2004 | Yanagisawa | G01R 1/0441 324/754.08 |
| 2013/0203298 | A1* | 8/2013 | Zhou | H01R 13/2435 439/700 |
| 2015/0233973 | A1* | 8/2015 | Wooden | G01R 3/00 29/876 |

FOREIGN PATENT DOCUMENTS

| | | |
|---|---|---|
| CN | 204649777 U | 9/2015 |
| JP | 2004-186174 A | 7/2004 |
| JP | 2004-325305 A | 11/2004 |
| JP | 5193200 B2 | 5/2013 |
| JP | 2015-507198 | 3/2015 |
| KR | 10-2004-0044377 A | 5/2004 |
| KR | 10-2004-0093040 A | 11/2004 |
| KR | 10-2009-0012249 A | 2/2009 |
| KR | 10-1482245 B1 | 1/2015 |
| KR | 10-1534778 B1 | 7/2015 |
| KR | 10-1552552 B1 | 9/2015 |
| TW | 200902985 A | 1/2009 |
| TW | 201339586 A | 10/2013 |
| TW | 201512678 A | 4/2015 |

OTHER PUBLICATIONS

Taiwan Notice of Allowance (TW20170108667), TIPO, dated Aug. 14, 2017.
Korean Office Action (KR 10-2016-0034619), KIPO, dated Nov. 29, 2017.
Korean Notice of Allowance (KR 10-2016-0034619), KIPO, dated Apr. 24, 2018.
Chinese Office Action (CN 201780018232.1), CNIPA, dated Mar. 19, 2020.
Japan Office Action (JP 2018-549255), JPO, dated Nov. 5, 2019.
Chinese Office Action (CN201780018232.1), CNIPA, dated Nov. 17, 2020.

* cited by examiner

TEST SOCKET ASSEMBLY

REFERENCE TO RELATED APPLICATIONS

This is a continuation of International Patent Application PCT/KR2017/003040 filed on Mar. 22, 2017, which designates the United States and claims priority of Korean Patent Application No. 10-2016-0034619 filed on Mar. 23, 2016, the entire contents of which are incorporated herein by reference.

FIELD OF THE INVENTION

The present invention relates to a test socket assembly which can improve an isolation characteristic of a terminal to be tested when electric properties of a test object are tested.

BACKGROUND OF THE INVENTION

To test electric properties of a radio frequency (RF) circuit device or the like, a test socket has been used for electrically connecting a terminal of the RF circuit device to be tested and a test terminal of the testing circuit.

In general, in order to decrease cross-talk between the terminals of the RF circuit device while the RF circuit device is tested, ground voltage is applied from a ground pin of the test socket to the circumference of the terminals to be tested in the RF circuit device.

By the way, a contact surface between the RF circuit device and the test socket may have rough flatness due to a machining error. The rough flatness does not make close contact but causes a gap between the RF circuit device and the test socket. Such a gap deteriorates the isolation characteristic of the terminals to be tested in the RF circuit device, and thus causes a problem of increasing the cross-talk between the terminals to be tested.

SUMMARY OF THE INVENTION

One or more exemplary embodiments are to provide a test socket assembly which improves an isolation characteristic of terminals of the test object while electric properties of a test object are tested, thereby decreasing cross-talk between the terminals to be tested.

According to an aspect of an exemplary embodiment, there is provided a test socket assembly including: a plurality of signal probes; a socket block including a bottom surface facing toward the testing circuit, a top surface facing toward the test object, a plurality of probe holes for accommodating the plurality of signal probes to be parallel with one another while opposite ends of the signal probes are exposed from the top surface and the bottom surface, and a recessed portion recessed from at least partial area of the top surface and the bottom surface excluding a circumferential area of the probe holes; and an elastic grounding member accommodated in the recessed portion and made of a conductive elastic material to come into contact with at least one of the test object and the testing circuit.

The socket block may include an isolation column surrounding an upper end area of the probe and protruding from a lower surface of the recessed portion.

The test socket assembly may further include an insulation member interposed in between the probe and the probe hole throughout at least partial lengthwise section, and having an end portion at a lower position as much as a predetermined depth from an end portion of the isolation column.

The test socket assembly may further include at least one ground pin provided in a ground pin hole for accommodating the ground pin so that a lower end portion of the ground pin can be exposed from the bottom surface of the socket block.

The elastic grounding member may be coated with a conductive material.

According to the present invention, it is possible to improve an isolation characteristic of terminals of the test object while electric properties of a test object are tested, thereby decreasing cross-talk between the terminals to be tested.

DETAILED DESCRIPTION OF THE INVENTION

Below, exemplary embodiments will be described in detail with reference to accompanying drawings. For convenience of description, the same or like numerals refer to the same or like elements throughout, and a top (or upper) side refers to a direction toward the test object and a bottom (lower) side refers to a direction toward the testing circuit.

Figure 1:
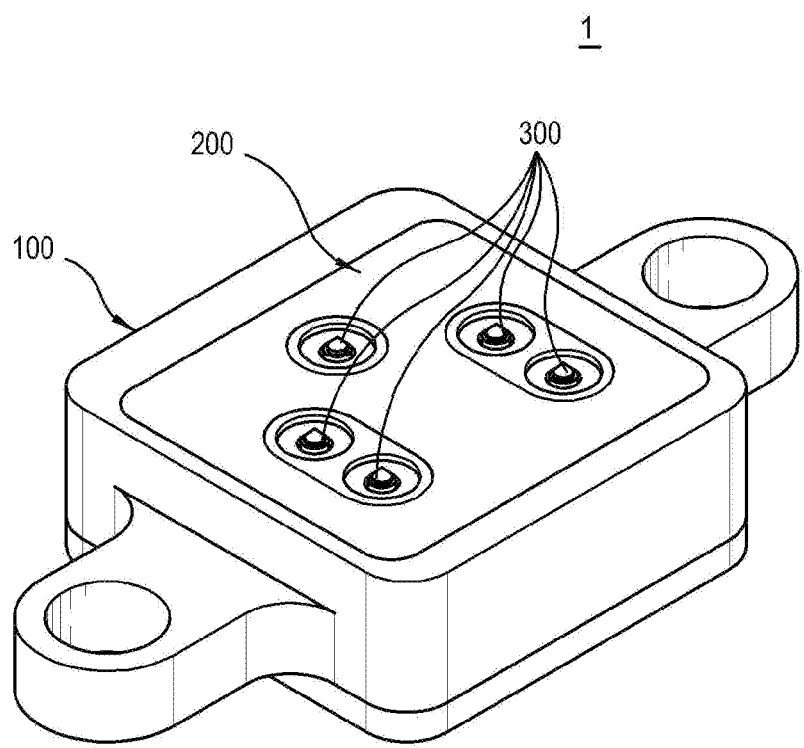
FIG. 1 is a perspective view of a test socket assembly according to an exemplary embodiment.

FIG. 1 is a perspective view of a test socket assembly according to an exemplary embodiment. The test socket assembly 1 according to an exemplary embodiment includes a socket block 100 and an elastic grounding member 200.

The socket block 100 is made of a conductive block, e.g. a brass block. The socket block 100 includes at least one signal probe 300 for electrically connecting a contact point to be tested in a test object 10 and a contact point for testing in a testing circuit 20. At this time, the signal probe 300 has to be electrically disconnected from the conductive socket block 100. The elastic grounding member 200 is accommodated in an accommodating recessed portion 120 formed on a top surface of the socket block 100 facing toward the test object 10. If the test object 10 is pressed against the top surface of the socket block 100 in order to test the electric properties of the test object 10, the elastic grounding member 200 comes into contact with a ground terminal 12 of the test object 10. At this time, the elastic grounding member 200 comes into close contact with a lower surface of the test object 10 in an area excluding the contact point of the test object to be tested, thereby achieving surface contact without any gap or crack between the socket block 100 and the area excluding the contact point 11 to be tested (hereinafter, referred to as a 'signal terminal') in the test object 10. Since the socket block 100 and the lower surface of the test object come into contact with each other without any crack therebetween in the area excluding the contact point 11 to be tested in the test object 10, the isolation characteristic of the signal terminal 11 is improved to thereby decrease cross-talk caused in between the signal terminals 11. Therefore, it is possible to accurately and reliably test the electric properties of the test object 10.

Figure 2:
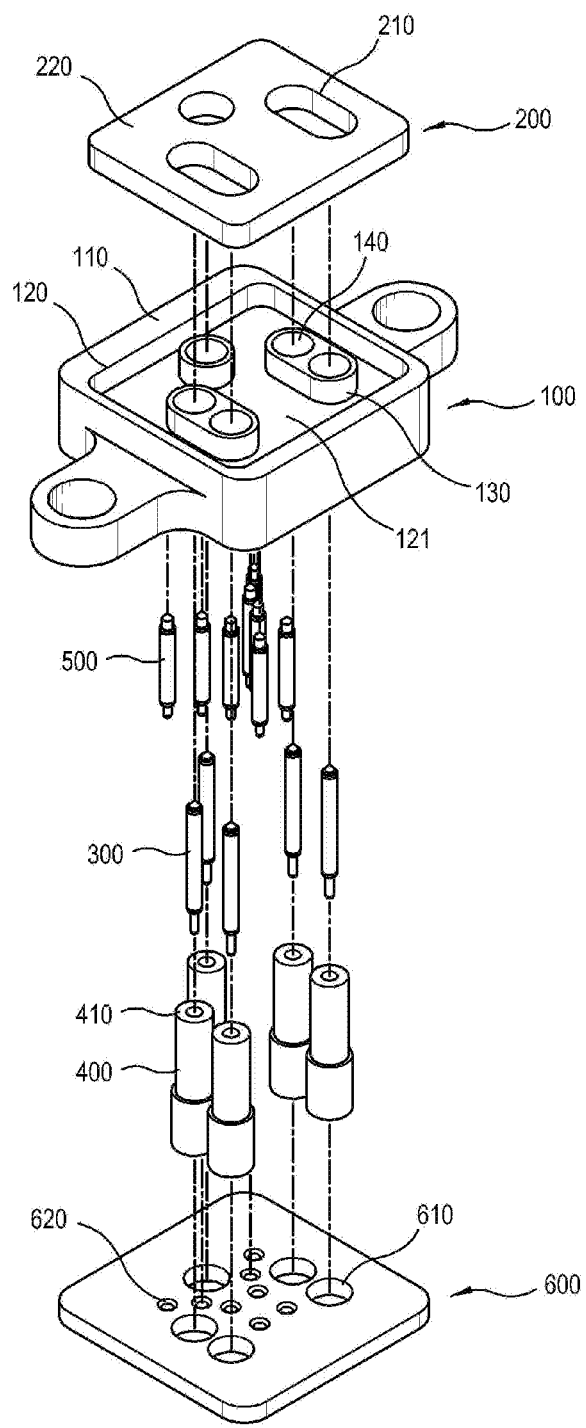
FIG. 2 is an exploded perspective view of the test socket assembly according to an exemplary embodiment.
Figure 3:
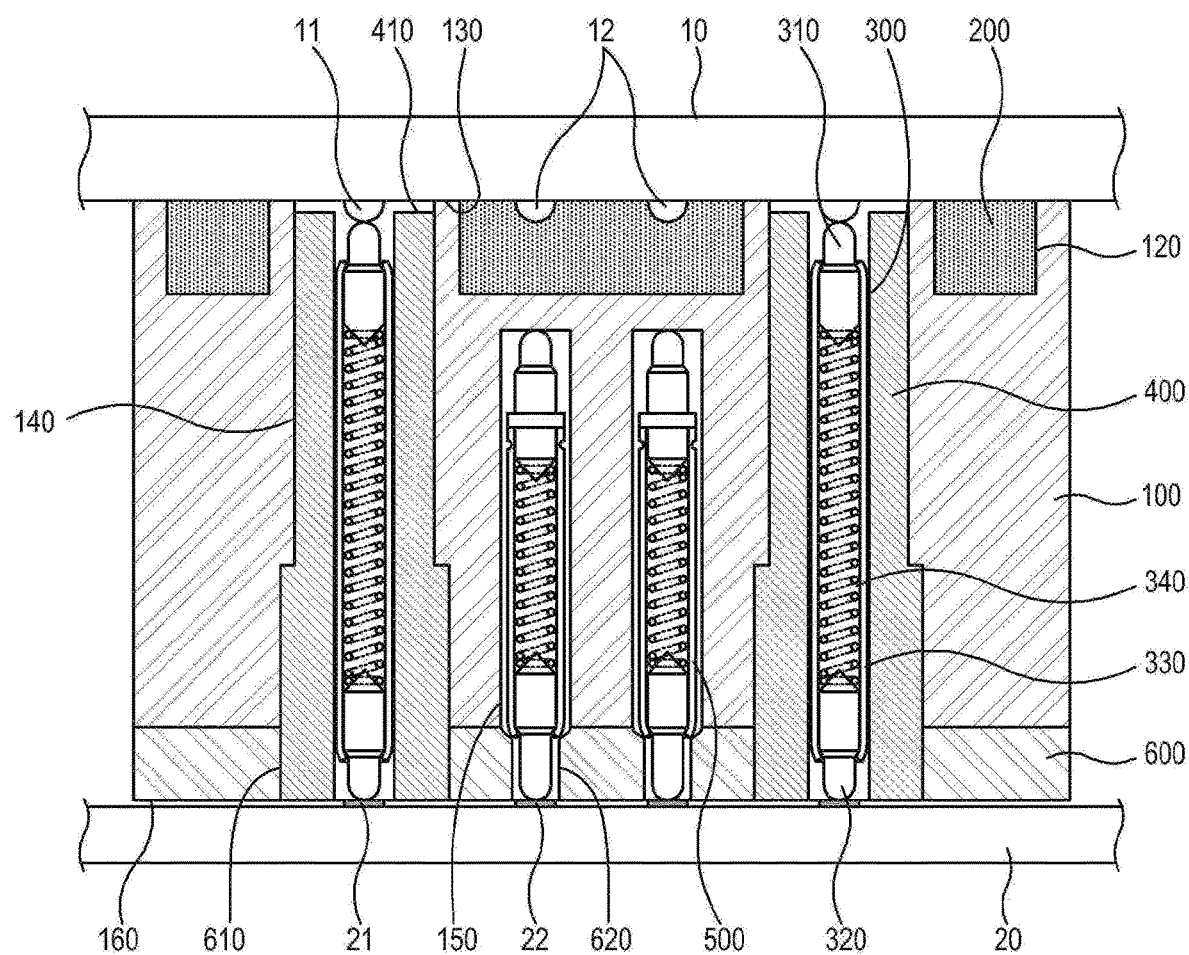
FIG. 3 is a cross-sectional view of the test socket assembly according to an exemplary embodiment.

FIG. 2 is an exploded perspective view of the test socket assembly according to an exemplary embodiment, and FIG. 3 is a cross-sectional view of the test socket assembly according to an exemplary embodiment. The test socket assembly 1 according to an exemplary embodiment includes the socket block 100 installed on a testing circuit 20, the elastic grounding member 200 accommodated in the accommodating recessed portion 120 of the socket block 100, and a plurality of signal probes 300 and at least one ground pin 500 supported in the socket block 100.

The socket block 100 includes a plurality of probe holes 140 for accommodating the plurality of signal probes 300, a ground pin hole 150 for accommodating at least one ground pin 500, the accommodating recessed portion 120 for accommodating the elastic grounding member 200, and an isolation column 130 protruding from the lower surface 121 of the accommodating recessed portion 120 and surrounding an upper end area of the signal probe 300.

The probe holes 140 are formed penetrating a bottom surface 160 facing toward the testing circuit 20 of the socket block 100 and a top surface 110 facing toward the test object 10, and are parallel with each other corresponding to the number of signal probes 300. The probe hole 140 accommodates the signal probe 300 surrounded with an insulation member 400.

The ground pin hole 150 is opened downward on the bottom surface 160 of the socket block 100 and accommodates the ground pin 500. Alternatively, the ground pin hole 150 may be opened on the top surface 110 as necessary.

The accommodating recessed portion 120 is recessed from the top surface 110 in at least partial area of the top surface 110 excluding the circumferential area of the probe holes 130. The accommodating recessed portion 120 accommodates the elastic grounding member 200.

The isolation column 130 is formed protruding in between the accommodating recessed portion 120 and the probe hole 140. The isolation column 130 stably isolates the signal probe 300 inserted in the probe hole 140 from the conductive elastic grounding member 200. Therefore, the isolation column 130 prevents the elastic grounding member 200 from direct contact with the insulation member 400 or the signal probe 300.

The elastic grounding member 200 is accommodated in the accommodating recessed portion 120 of the socket block 100. The elastic grounding member 200 has an isolation column through hole 210 for accommodating the isolation column 130. For example, the elastic grounding member 200 may be made of conductive rubber where conductive particles are mixed into an elastic material. To improve conductivity, the surface of the elastic grounding member 200 may be coated with a conductive material. For example, the elastic grounding member 200 may be coated with gold, silver, copper, etc. When the elastic grounding member 200 is accommodated in the accommodating recessed portion 120, a top surface 220 of the elastic grounding member 200 more protrudes than the top surface 110 of the socket block 100. When the test object 10 undergoes a test, the test object 10 is pressed down toward the top surface 110 of the socket block 100. As the test object 10 is pressed down, the elastic grounding member 200 comes into contact with the ground terminal 12 and bottom surface of the test object 10. Since the elastic grounding member 200 has elasticity, the bottom surface of the test object 10 and the top surface of the elastic grounding member 220 can come into close contact without any crack. Therefore, the contact point to be tested in the test object 10, e.g. the signal terminal 11 is improved in the isolation characteristic.

For electric insulation from the socket block 100, the signal probe 300 is accommodated in the insulation member 400 and then inserted in and mounted to the probe hole 140 of the socket block 100. The signal probe 300 is supported in the socket block 100 and has exposed upper and lower ends. Specifically, the upper end of the signal probe 300 contacts the contact point to be tested in the test object 10, e.g. the signal terminal 11. The lower end of the signal probe 300 contacts a contact point for testing in the testing circuit 20 (hereinafter, referred to as a 'signal pad' 21). At least one between the upper and lower ends of the signal probe 300 is elastically retractable in its lengthwise direction. FIG. 3 illustrates that the signal probe 300 includes a first plunger 310 as the upper end, a second plunger 320 as the lower end, a spring 340 interposed in between the first plunger 310 and the second plunger 320, and a cylindrical barrel 330 accommodating the first plunger 310, the second plunger 320 and the spring 340, but the signal probe 300 is not limited to such a structure and may have various structures.

The insulation member 400 is interposed in between the signal probe 300 and the probe hole 140 for the purposed of electric insulation and constant impedance between the signal probe 300 and the socket block 100. The insulation member 400 has an upper end portion 410 at a low position as much as a predetermined depth from the upper end of the isolation column 130. That is, the upper end portion 410 of the insulation member 400 may be positioned at the same height as or at a height lower than the lower surface 121 of the accommodating recessed portion 120. Thus, when the test object 10 undergoes a test, the signal terminal 11 of the test object 10 can be accommodated in a gap formed in between the upper end portion 410 of the insulation member 400 and the upper end of the isolation column 130. In this case, a signal terminal (bump) 11 does not come into contact with the isolation column 130, and thus the signal terminal 11 is accommodated in the gap formed in between the upper end portion 410 of the insulation member 400 and the upper end of the isolation column 130, thereby further improving the isolation characteristic of the signal terminal 11. Accordingly, it is possible to more decrease cross-talk between the signal terminals 11.

The ground pin 500 is accommodated in the ground pin hole 150 of the socket block 100 and has a lower end portion exposed from the bottom surface of the socket block 100. The lower end portion of the ground pin 500 comes into contact with a grounding pad 22 of the testing circuit 20 when the testing circuit 20 and the socket block 100 are coupled to each other. The upper end portion of the ground pin 500 comes into contact with the upper end of the ground pin hole 150. When the testing circuit 20 and the socket block 100 are coupled to each other, a ground voltage, e.g. a voltage equal to or lower than 0V is applied from the grounding pad 22 to the ground pin 500. The applied ground voltage is then applied to the socket block 100 through the upper end portion of the ground pin 500. Since the socket block 100 is made of conductive metal or coated with a conductive material, the ground voltage applied through the ground pin 500 makes the whole of the socket block 100 be grounded.

A coupling member 600 is made of a conductive material. The coupling member 600 is shaped like a plate formed with a plurality of signal-probe through holes 610 and a plurality of ground-pin through holes 620, and coupled with the bottom surface of the socket block 100 after the signal probe 300 and the ground pin 500 are inserted into the socket block 100. The coupling member 600 is coupled to and supported by the socket block 100 after the signal probe 300 and the ground pin 500 are respectively inserted from the bottom into the probe hole 140 of the socket block 100 and the ground pin hole 500.

In the foregoing test socket assembly 1 according to an exemplary embodiment, the elastic grounding member 200 makes the test object 10 and the socket block 100 come into contact with each other without any crack in the area excluding the area where the signal terminal 11 of the test object 10 contacts the signal probe 300 of the socket block 100. By this contact, the isolation characteristic is improved in the area where the signal terminal 11 of the test object 10 and the signal probe 300 of the socket block 100 are in contact with each other. Therefore, when the test object 10 undergoes a test, it is possible to decrease the cross-talk due to leakage or the like of an RF signal caused in a crack between the test object 10 and the socket block 100. In result, the cross-talk between the signal terminals 11 is decreased, and it is thus possible to test the electric properties of the test object 10 more reliably.

Further, the upper end portion of the ground pin 500 may be fastened to the inside of the ground pin hole 150 of the socket block 100 and thus prevented from moving up and down while the test object 1 undergoes a test. Therefore, the ground pin 500 is improved in durability, and there are no needs of replacing the ground pin.

Figure 4:
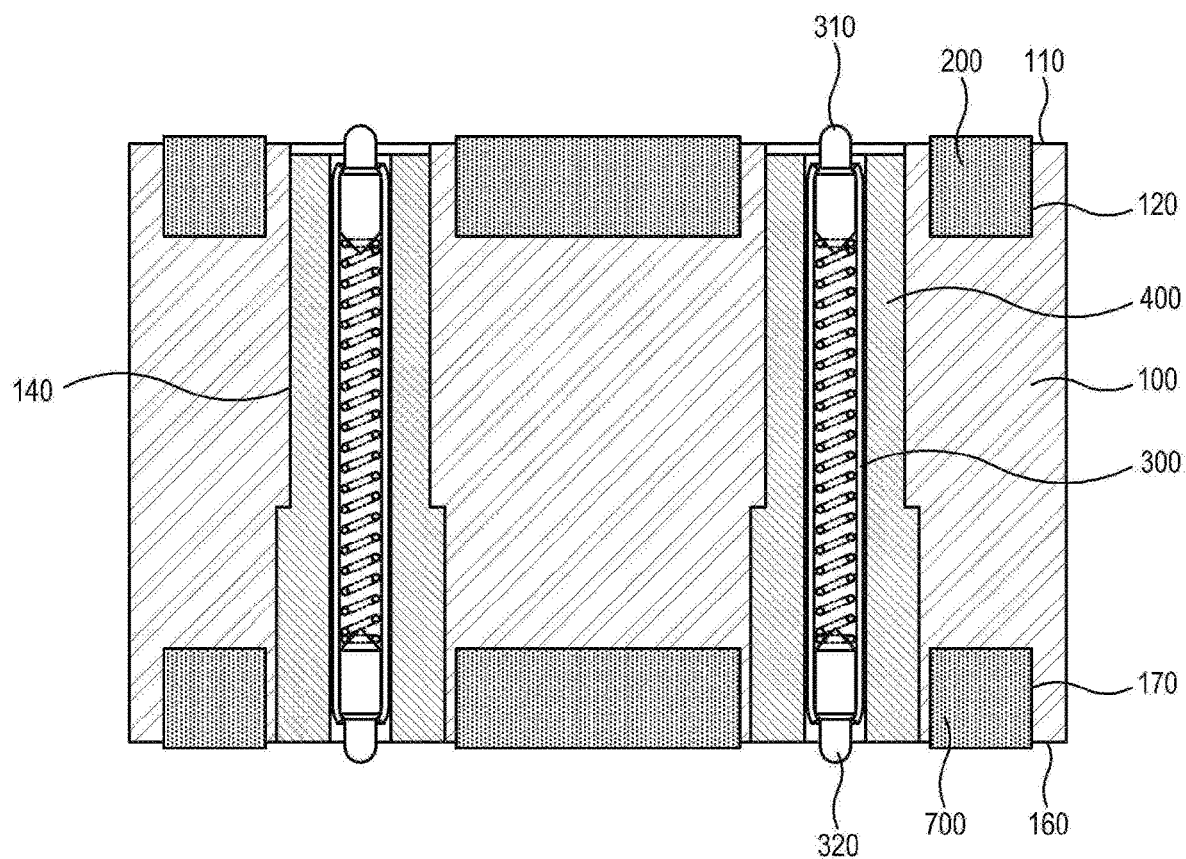
FIG. 4 is a cross-sectional view of a test socket assembly according to another exemplary embodiment.

FIG. 4 is a cross-sectional view of a test socket assembly according to another exemplary embodiment. For clarity and briefness, descriptions about the same structures as those of the test socket assembly 1 shown in FIG. 3 will be omitted, and only difference will be described.

A test socket assembly 2 according to this exemplary embodiment includes a first accommodating recessed portion 120 recessed from the top surface of the socket block 100, and a second accommodating recessed portion 170 recessed from the bottom surface of the socket block 100. A first elastic grounding member 200 is accommodated in the first accommodating recessed portion 120, and a second elastic grounding member 700 is accommodated in the second accommodating recessed portion 170.

The second accommodating recessed portion 170 and the second elastic grounding member 700 are respectively similar in shape and function to the accommodating recessed portion 120 and the elastic grounding member 200 shown in FIG. 2 and FIG. 3. That is, the second elastic grounding member 700 makes the testing circuit 20 and the socket block 100 come into contact with each other without any crack in an area excluding an area where the signal pad 21 (see FIG. 3) of the testing circuit 20 and the signal probe 300 of the socket block 100 are in contact with each other. This contact improves the isolation characteristic in the area where the signal pad 21 of the testing circuit 20 and the signal probe 300 of the socket block 100 are in contact with each other. Accordingly, cross-talk between the signal pads 21 due to leakage or the like of an RF signal is decreased to thereby more accurately test the electric properties of the test object 10.

Further, the test socket assembly 2 according to this exemplary embodiment does not include any ground pin for receiving the ground voltage from the testing circuit 20. The test socket assembly 2 receives the ground voltage as the bottom surface of the conductive elastic grounding member 700 comes into direct contact with the grounding pad 22 (see FIG. 3) of the testing circuit 20. In this case where the elastic grounding member 700 is in direct contact with the grounding pad 22, close contact between the socket block 100 and the testing circuit 20 is also kept by the elasticity of the elastic grounding member 700.

In the foregoing test socket assembly 2 according to this exemplary embodiment, the elastic grounding member is interposed in between the socket block 100 and the test object 10 and between the socket block 100 and the testing circuit 20, thereby improving the isolation characteristic of an RF signal line. Accordingly, reliability of testing the electric properties of the test object is also improved.

In addition, there are no needs of the ground pin for applying the ground voltage from the grounding pad 22 of the test device 20 to the socket block 100, thereby reducing manufacturing costs of the test socket assembly. Further, it is possible to reduce maintenance costs of the test socket assembly.

Figure 5:
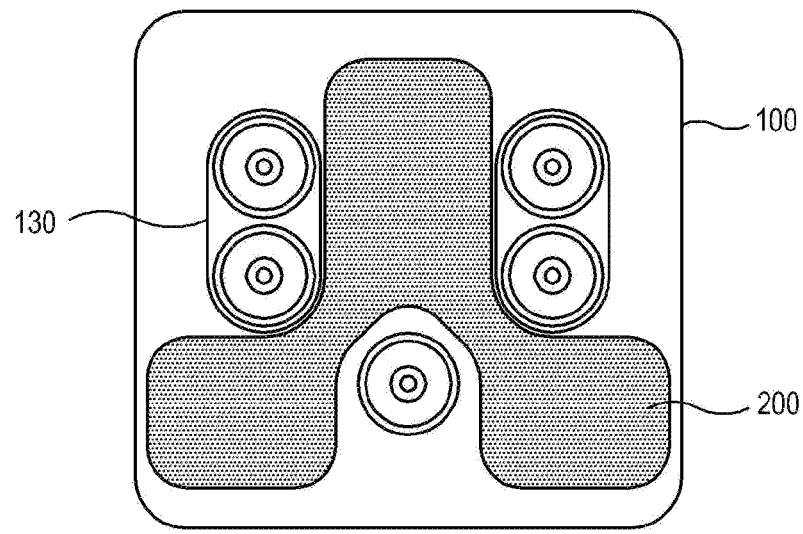
FIG. 5 and FIG. 6 are plan views of showing examples of an elastic grounding member.
Figure 6:
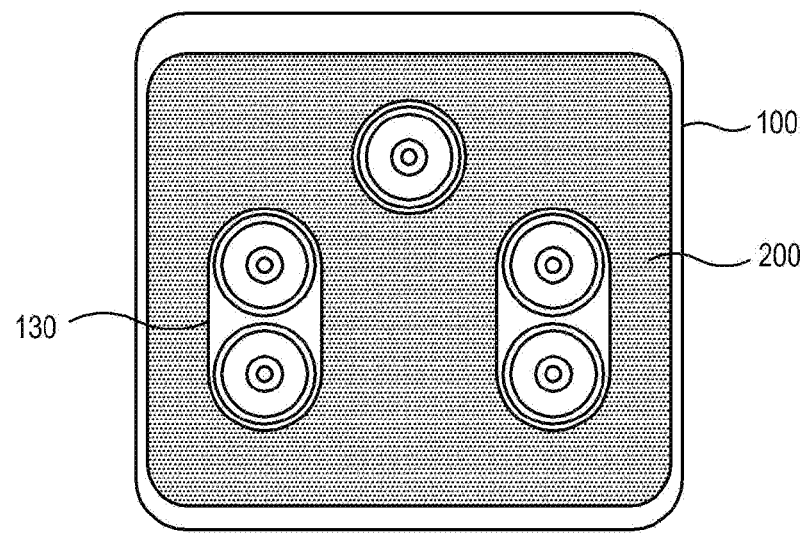
Figure 7A:
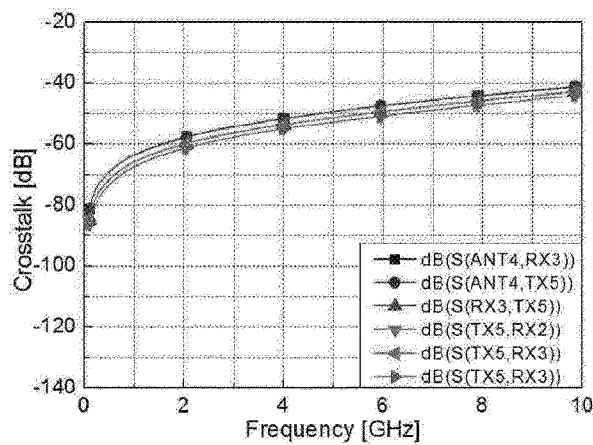
FIGS. 7A to 7C show simulation results of cross-talk in the test socket assembly according to an exemplary embodiment.
Figure 7B:
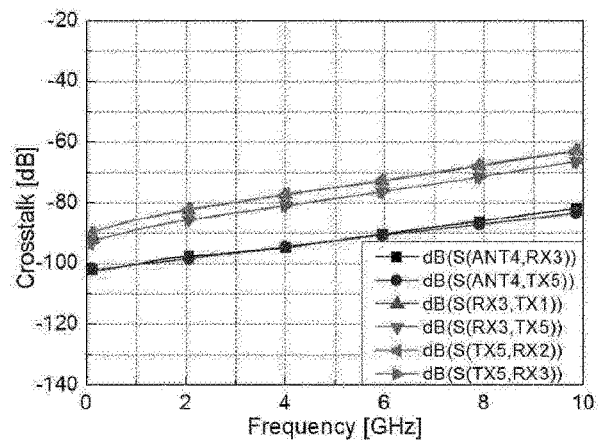
Figure 7C:
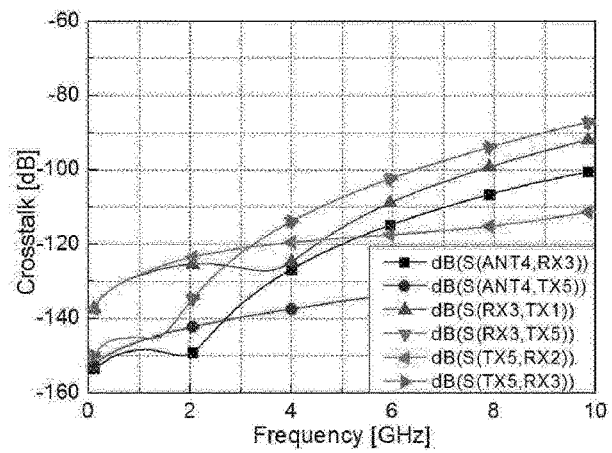

FIG. 5 and FIG. 6 are plan views of showing examples of an elastic grounding member, and FIGS. 7A to 7C show simulation results of cross-talk in the test socket assembly according to an exemplary embodiment.

FIG. 5 shows the elastic grounding member 200 surrounding a partial circumference of the isolation column 130, and FIG. 6 shows the elastic grounding member 200 surrounding the whole isolation column 130. In FIG. 7A shows a graph of cross-talk at a contact point to be tested when the elastic grounding member 200 is not given, FIG. 7B shows a graph of cross-talk at a contact point to be tested when the elastic grounding member 200 is give as shown in FIG. 5, and FIG. 7C shows a graph of cross-talk at a contact point to be tested when the elastic grounding member 200 is given as shown in FIG. 6.

Referring to FIGS. 7A to 7C, the cross-talk caused when the test object is tested by the test socket with the elastic grounding member 200 according to the present invention was significantly decreased more than the cross-talk caused when the test object is tested by the test socket without the elastic grounding member. When the test object undergoes a test, the elastic grounding member 200 is in close contact with a partial lower surface or the entire lower surface of the test object except the signal terminal of the test object. Accordingly, the test socket with the elastic grounding member 200 according to the present invention more improves the isolation characteristic between the contact points to be tested in the test object than the test socket without the elastic grounding member.

In result, the test socket assembly according to an exemplary embodiment employs the elastic grounding member 200 to improve the isolation characteristic of the contact points to be tested in the test object, thereby significantly reducing the cross-talk caused in between the contact points to be tested. Accordingly, it is possible to improve the reliability of testing the electric properties of the test object.

According to an exemplary embodiment, when the test object undergoes a test, the electric properties of the test object are more reliably tested since the isolation characteristic of the terminal to be tested is improved.

Although a few exemplary embodiments have been shown and described, it will be appreciated by those skilled in the art that changes may be made in these exemplary embodiments without departing from the principles and spirit of the invention.

What is claimed is:

1. A test socket assembly for electrically connecting a contact point to be tested in a test object and a contact point for testing in a testing circuit, the test socket assembly comprising:
    a plurality of signal probes;
    a socket block comprising a bottom surface facing toward the testing circuit, a top surface facing toward the test object, a plurality of probe holes for accommodating the plurality of signal probes to be parallel with one another while allowing opposite ends of the signal probes to be exposed from the top surface and the bottom surface of the socket block, and a recessed portion recessed from at least partial area of the top surface and the bottom surface excluding a circumferential area of the probe holes; and
    an elastic grounding member accommodated in the recessed portion and made of a conductive elastic material to come into contact with at least one of the test object and the testing circuit,
    wherein the socket block comprises an isolation column protruded from the recessed portion of the top surface and the bottom of the socket block, respectively, so as to surround an upper end portion and a lower end portion of the signal probes.

2. The test socket assembly according to claim 1, further comprising an insulation member interposed in between the signal probe and the probe hole, wherein an end portion of the insulation member is recessed by a predetermined depth from an end portion of the isolation column.

3. The test socket assembly according to claim 1, further comprising at least one ground pin provided in a ground pin hole for accommodating the ground pin so as to allow a lower end portion of the ground pin to be exposed from the bottom surface of the socket block.

4. The test socket assembly according to claim 1, wherein the elastic grounding member is coated with a conductive material.

* * * * *